(12) United States Patent
Petchenev et al.

(10) Patent No.: US 7,065,474 B2
(45) Date of Patent: Jun. 20, 2006

(54) FREQUENCY RECTIFICATION SYSTEM: APPARATUS AND METHOD

(75) Inventors: Alexei Petchenev, Carson City, NV (US); Olga Malakhova, Carson City, NV (US)

(73) Assignee: Bently Nevada, LLC, Minden, NV (US)

( * ) Notice: Subject to any disclaimer, the term of this patent is extended or adjusted under 35 U.S.C. 154(b) by 0 days.

(21) Appl. No.: 10/846,183

(22) Filed: May 14, 2004

(65) Prior Publication Data

US 2005/0256656 A1 Nov. 17, 2005

(51) Int. Cl.
 *G06F 17/00* (2006.01)
(52) U.S. Cl. .................. 702/190; 702/189; 702/75; 702/76; 702/191
(58) Field of Classification Search ........ 702/189–191, 702/70, 73–77, 69, 66, 106, 195; 331/1 R, 331/18, 19, 44, 64
See application file for complete search history.

(56) References Cited

U.S. PATENT DOCUMENTS 6,401,057 B1 * 6/2002 Kadtke et al. ............... 702/189
6,499,002 B1 * 12/2002 Lancaster ................... 702/191
6,522,996 B1 * 2/2003 Groutage .................... 702/196

* cited by examiner

*Primary Examiner*—Hal Wachsman
(74) *Attorney, Agent, or Firm*—Dennis A. DeBoo

(57) ABSTRACT

Frequency rectification system using a Van der Pol oscillator for processing an asset signal by obtaining a complex signal from an asset comprised of a noise signal and a signal of interest having a corresponding frequency of interest wherein the complex signal includes a first spectrum having all of its largest spectral peaks corresponding to the noise signal such that the signal of interest is hidden under the noise signal. The system processes the complex signal with the Van der Pol oscillator with selected parameters for rectifying the complex signal into a rectified signal such that the noise signal is abated and the rectified signal is comprised of a second spectrum having a largest spectral peak corresponding to the signal of interest with all other spectral peaks smaller. The system extracts the frequency of interest from the rectified signal with an extraction module for use in providing asset information.

20 Claims, 9 Drawing Sheets

FREQUENCY RECTIFICATION SYSTEM: APPARATUS AND METHOD

BACKGROUND OF THE INVENTION

This invention relates generally to a frequency rectification system, and, in particular, to a frequency rectification system: apparatus and method using a. Van der Pol Oscillator for rectifying noisy signals for extracting or recovering frequencies of signals that are hidden or buried under noise for monitoring, protecting and/or managing assets including a multifarious grouping of machinery, processes, and instrumentalities.

In signal processing, a signal and its frequency of interest is usually evaluated as a major Fourier transformation component. It is known that in many instances the particular frequency of interest might not be the major Fourier component within an entire frequency range and yet, it still might have the highest amplitude within a certain frequency band. Thus, the frequency of interest is typically obtained by filtering the signal to a certain frequency band surrounding the frequency of interest such that the frequency of interest is the only one or at least, the major one in the spectrum. In such a case, the corresponding spectrum peak and its frequency are easily detected. Thus, in many instances it is possible to initially select a small enough frequency band so that the frequency of interest is associated with a major component within the selected band.

This approach works fine if there is no or little noise in the frequency band that is filtered from the signal and that surrounds the frequency of interest.

However, this approach is problematic in instances when the signal is so noisy that even in the closest proximity to the signal of interest the noise is higher than that of the signal itself. In other words, even if the smallest proximity to the signal of interest is chosen in the spectrum, the signal of interest is completely "buried" under the noise, so that all the spectrum peaks represent those of the noise, rather than of the signal of interest. Hence, in these instances, the signal of interest is too small when compared to the noise and thus, picking a major component will not produce the frequency of interest, but rather a random result.

Hence, there is a need for obtaining a signal of interest from a noisy signal that is so noisy that even in the closest proximity to the signal of interest the noise is higher than that of the signal of interest itself. In other words, there is a need for obtaining a signal of interest that is completely "buried" under noise from a noisy signal comprised of spectrum peaks which represent those of the noise, rather than that of the signal of interest. Moreover, there is a need for solving the problem of obtaining a signal of interest that is "buried" under noise rather than obtaining a random result for monitoring, protecting and/or managing assets including a multifarious grouping of machinery, processes, and instrumentalities.

BRIEF SUMMARY OF THE INVENTION

The present invention is distinguished over the known prior art in a multiplicity of ways. For one thing, one embodiment of the invention provides a system for obtaining a signal of interest from a noisy signal that is so noisy that even in the closest proximity to the signal of interest the noise is higher than that of the signal of interest itself. Thus, one embodiment of the invention provides a system for obtaining a signal of interest that is completely "buried" under noise from a noisy signal comprised of spectrum peaks which represent those of the noise, rather than that of the signal of interest. Hence, in one aspect, one embodiment of the invention provides a system for solving the problem of obtaining a signal of interest that is "buried" under noise rather than obtaining a random result for monitoring, protecting and/or managing assets including a multifarious grouping of machinery, processes, and instrumentalities.

In one embodiment of the invention, a frequency rectification system for processing asset signals is comprised of: 1) means for generating a complex signal from an asset comprised of a noise signal and a signal of interest having a corresponding frequency of interest wherein the complex signal includes a first spectrum having all of its largest spectral peaks corresponding to noise such that the signal of interest at the frequency of interest is hidden under the noise signal; 2) a Van der Pol oscillator operatively coupled to the signal generator and including selectable parameters for receiving and rectifying the complex signal into a rectified signal such that the noise signal is abated and the rectified signal is comprised of a second spectrum having a largest spectral peak corresponding to the signal of interest with all other spectral peaks smaller; 3) extraction means, operatively coupled to the Van der Pol oscillator, for extracting the frequency of interest from the rectified signal; and 4) a decision support means, operatively coupled to the extraction means, for making decisions as a function of the extracted frequency of interest and for providing recommendations based on the decision making for use in monitoring, protecting and/or managing assets.

In another embodiment of the invention, a frequency rectification system for processing asset signals is comprised of: 1) means for generating a signal from an asset comprised of a signal of interest having a corresponding frequency of interest; the signal further including a noise signal having a magnitude greater than a magnitude of the signal of interest at the frequency of interest wherein the signal of interest is hidden under the noise signal; 2) a Van der pol oscillator means operatively coupled to the signal generating means for rectifying the signal such that the noise signal has a magnitude less than the magnitude of the signal of interest at the frequency of interest; 3) means for extracting the frequency of interest from the rectified signal, and 4) a decision support means, operatively coupled to the extraction means, for making decisions as a function of the extracted frequency of interest and for providing asset recommendations based on the decision making for use in monitoring, protecting and/or managing the assets such as machine, process, and/or instrumentality assets.

In another embodiment of the invention, a frequency rectification method for processing asset signals is comprised of the steps including: computer modeling a Van der Pol oscillator having an input and an output; selecting parameters of the Van der Pol oscillator model such that a natural frequency of the Van der Pol oscillator model is approximate a frequency of interest of a signal of interest; applying a complex signal to the input of the Van der Pol oscillator wherein the complex signal is comprised of a noise signal and the signal of interest having the corresponding frequency of interest and wherein the complex signal includes a first spectrum having all of its largest spectral peaks corresponding to the noise signal such that the signal of interest at the frequency of interest is hidden under the noise signal; rectifying the complex signal with the Van der Pol oscillator model for providing a rectified output signal wherein the noise signal is abated and the rectified output signal is comprised of a second spectrum having a largest spectral peak corresponding to the signal of interest with all other spectral peaks smaller; transforming the rectified output signal into its spectrum; determining the frequency of interest by determining a frequency of the largest spectral peak of the transformed rectified output signal; making decisions as a function of the extracted frequency of interest; and making recommendations based on the decision making step.

Moreover, having thus summarized the invention, it should be apparent that numerous modifications and adaptations may be resorted to without departing from the scope and fair meaning of the present invention as set forth herein by the claims following the detailed description of the invention.

DETAILED DESCRIPTION OF THE INVENTION

Figure 1:
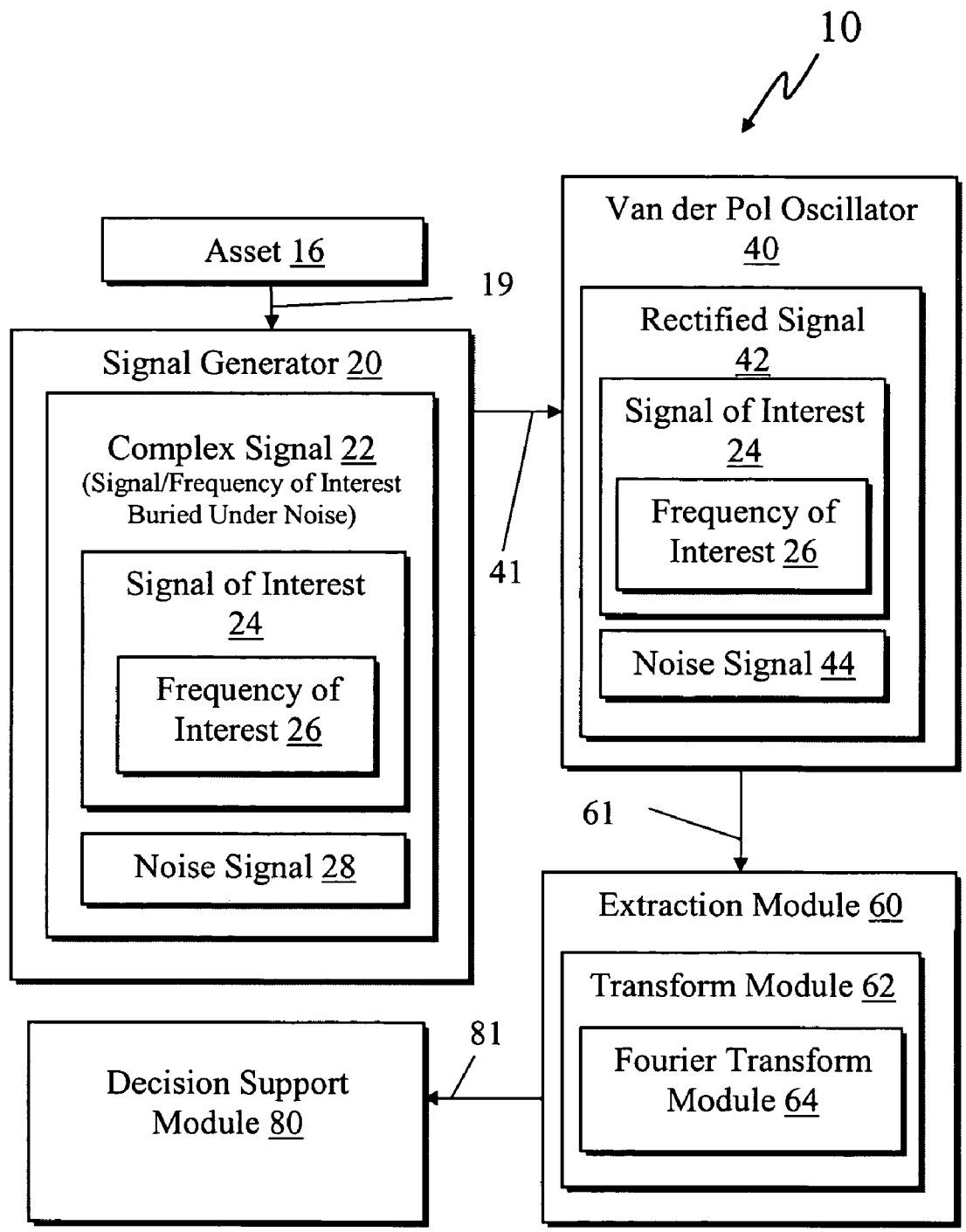
FIG. 1 is a functional block diagram view of a frequency rectification system for recovering a signal that is hidden or buried under noise.

Considering the drawings, wherein like reference numerals denote like parts throughout the various drawing figures, reference numeral 10 is directed to a frequency rectification system: apparatus and method for processing noisy signals of assets for monitoring, protecting and/or managing assets including a multifarious grouping of machinery, processes, and instrumentalities.

In its essence, and referring to FIG. 1, an embodiment of the invention provides a frequency rectification system 10 comprised of a Van der Pol oscillator 40 which can be a physical/analog model or a numerically simulated computer model operatively coupled, via connection 41, to a signal generator 20 which outputs a complex signal 22 which acts as a forcing function on the Van der Pol oscillator 40 and which is comprised of a signal of interest 24 having a corresponding frequency of interest 26 hidden or buried under a noise signal 28 having a magnitude greater than a magnitude of the signal of interest 24 at the frequency of interest 26. The Van der Pol oscillator 40 receives the complex signal 22 from the signal generator 20 and rectifies the received complex signal 22 into a rectified output signal 42 such that the Van der Pol oscillator 40 synchronizes to the signal of interest 24 at the frequency of interest 26 over time while abating the noise signal 28 such that the rectified signal 42 is comprised of a noise signal 44 having a magnitude less than the magnitude of the signal of interest 24 at the frequency of interest 26.

The system 10 can be further comprised of an extraction module 60 operatively coupled, via connection 61, to the Van der Pol oscillator 40 for receiving the rectified output signal 42 and extracting the frequency of interest 26 from the rectified output signal 42 with a transform module 62 such as a Fourier transform module 64 transforming the rectified output signal 42 into its spectrum which is different from a spectrum of the complex signal 22 and which is comprised of a distinctive or largest spectral peak, which corresponds to the signal of interest 24 with all other spectral peaks smaller, and then determining the frequency of interest 26 by determining the frequency of the largest spectral peak of the transformed rectified signal 42 for use in, for example, monitoring, protecting and/or managing an asset 16 as a function of the extracted frequency of interest 26.

The system 10 can also be further comprised of a decision support module 80 operatively coupled, via connection 81, to the extraction module 60 for making decisions as a function of the extracted frequency of interest 26 for monitoring, protecting and/or managing asset 16 operatively coupled, via connection 21, to the signal generator 20.

Figure 2:
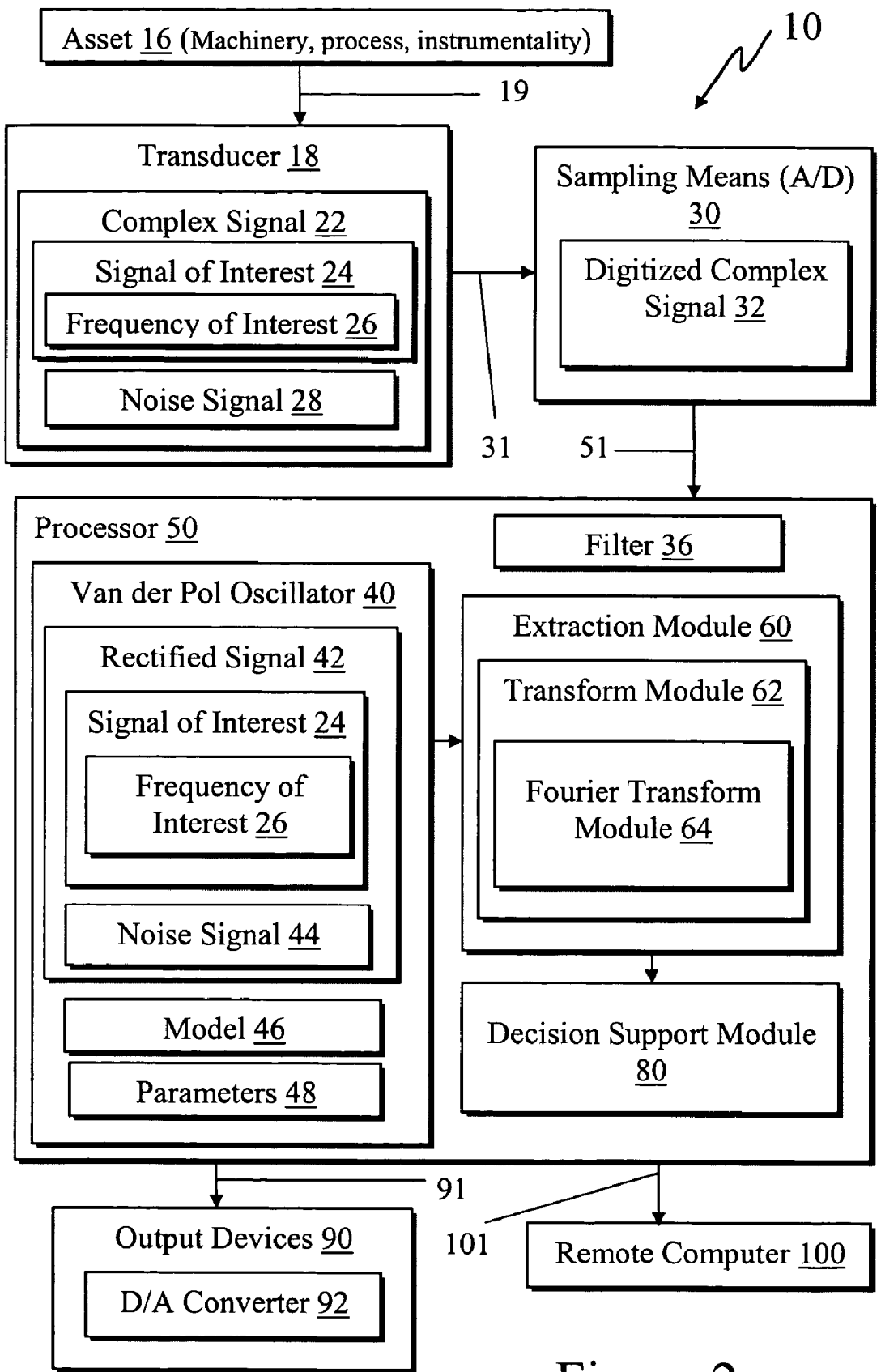
FIG. 2 is a functional block diagram view further detailing the frequency rectification system for recovering a signal that is hidden or buried under noise.

For example, and referring to FIGS. 1 and 2, in an embodiment of the invention the signal generator 20 can be in the form of a transducer 18 (FIG. 2) operatively coupled, via connection 19, to asset 16 for producing the complex signal 22 correlative to asset status or information which is transformed by the system 10 into an extracted frequency of interest 26 which is processed by the decision support module or means 80 for making decisions and/or recommendations for use in, for example, monitoring, protecting and/or managing machinery, process, and/or an instrumentality assets.

Thus, in an embodiment of the invention, the system 10 rectifies the complex signal 22 that is comprised of the signal of interest 24 buried or hidden under the noise signal 28 such that the resulting waveform, rectified output signal 42, provides a better opportunity to uncover the frequency of interest 26 of the buried signal of interest 24.

Particularly, there might be no distinctive spectral peak in the incoming complex signal 22, which corresponds to the signal of interest 24. Instead of that, there might be many spectral peaks that relate only to the noise signal 28. This happens when there is too much noise, which results in the signal of interest 24 being buried or hidden under the noise signal 28. In such a case, the detection of the frequency of interest 26 of the signal of interest 24 has been heretofore, problematic and unsolved.

The frequency rectification system 10 recognizes and solves this problem by using a Van der Pol Oscillator 40, with selected parameters, for rectifying an applied complex signal 22 into a rectified signal 42 and then transforming the rectified signal 42 into its spectrum which is different from the spectrum of the complex signal 22 and which is comprised of a distinctive or largest spectral peak which corresponds to the signal of interest 24 with all other spectral peaks smaller. Next, the system 10 determines the frequency of interest 26 by determining the frequency of the largest spectral peak of the transformed rectified signal 42 and then, the system uses the determined frequency of interest 26 for monitoring, protecting, and/or managing asset 16 from which complex signal 22 was engendered.

More specifically, and referring to FIG. 2, one embodiment of the invention provides a frequency rectification system 10 comprised of a processor or computer 50 including the Van der Pol Oscillator 40 comprised of a numerically simulated Van der Pol oscillator model 46 having user selectable parameters or coefficients 48 for obtaining a rectified output signal or waveform which includes negligible own or natural frequency, includes much smaller noise, and includes a dominating frequency of interest by properly selecting the Van der Pol oscillator parameters or coefficients such that its own or natural frequency is approximate the frequency of interest and which can be empirically determined or obtained from knowledge database.

The processor 50 is operatively coupled, via connection 51, to a sampling/digitizing means 30 which, in turn, is operatively coupled to at least one transducer 18, via connection 31. The transducer 18 is operatively coupled to the asset 16, via connection 19, wherein asset 16 is in the form of, for example, machinery such as a rotating or reciprocating machine, a process such as an industrial process, or other instrumentality for measuring physical asset parameters for monitoring the asset and outputting complex signal 22 to the sampling/digitizing means 30.

The outputted complex signal 22 is received by the sampling/digitizing means 30 and is comprised of the signal of interest 24 having the corresponding frequency of interest 26 hidden or buried under the noise signal 28 such that the noise signal has its magnitude or amplitude greater than the magnitude or amplitude of the signal of interest 24 at the frequency of interest 26 or in other words, such that the signal of interest 24 has its magnitude or amplitude lower than a magnitude or amplitude of the noise signal 28 at the frequency of interest 26 thereby being hidden or buried under the noise signal 28.

The sampling/digitizing means 30, for example, an analog to digital converter receives, samples, and digitizes the complex signal 22 into a digitized complex signal 32. Once the complex signal 22 from the transducer 18 is digitized into the digitized complex signal 32 by the sampling/digitizing means 30 it is outputted to the processor 50.

The processor or processing means 50 receives the digitized complex signal 32 and processes the digitized complex signal 32 as a function of said Van der Pol oscillator model 46 having user selectable parameters 48 selected such that the natural frequency of the Van der Pol oscillator model 46 is approximate the frequency of interest 26. The processor 50 in combination with the Van der Pol oscillator 40 processes the digitized complex signal by using the digitized complex signal as a forcing function input to the Van der Pol oscillator 40 and rectifying the digitized complex signal 32 into a rectified signal 42 outputted by the Van der Pol oscillator wherein the Van der Pol oscillator 40 synchronizes to the signal of interest at the frequency of interest over time while abating the noise signal such that it has a magnitude less than the magnitude of the signal of interest at the frequency of interest. In theory, the noise signal pushes the frequency of the Van der Pol oscillator in opposite directions over time and is eliminated by the Van der Pol oscillator whereas the signal of interest has a substantially constant frequency synchronized to by the Van der Pol oscillator 40.

Still referring to FIG. 2, and in one embodiment of the invention, the processor 50 incorporates the extractions means 60 for extracting the frequency of interest 26 from the rectified digital signal 42 by performing a transformation on the rectified signal with the transform module or means 62 which, in one embodiment, is the Fourier transform module or means 64 which performs the Fourier transform on the rectified signal 42 with the results processed by the processor 50 for evaluating a major component of the Fourier transformation for recovering the frequency of interest previously hidden under the noise signal for use in determining asset status. Specifically, the Fourier transform module 64 transforms the rectified signal 42 into its spectrum which is different from a spectrum of the complex signal 22 and which is comprised of a distinctive or largest spectral peak, which corresponds to the signal of interest 24 with all other spectral peaks smaller, and then processor 50 determines the frequency of interest 26 by determining the frequency of the largest spectral peak of the transformed rectified signal 42 for use in, for example, monitoring, protecting and/or managing machinery, process, and/or an instrumentality assets as a function of the extracted frequency of interest 26.

Figure 3:
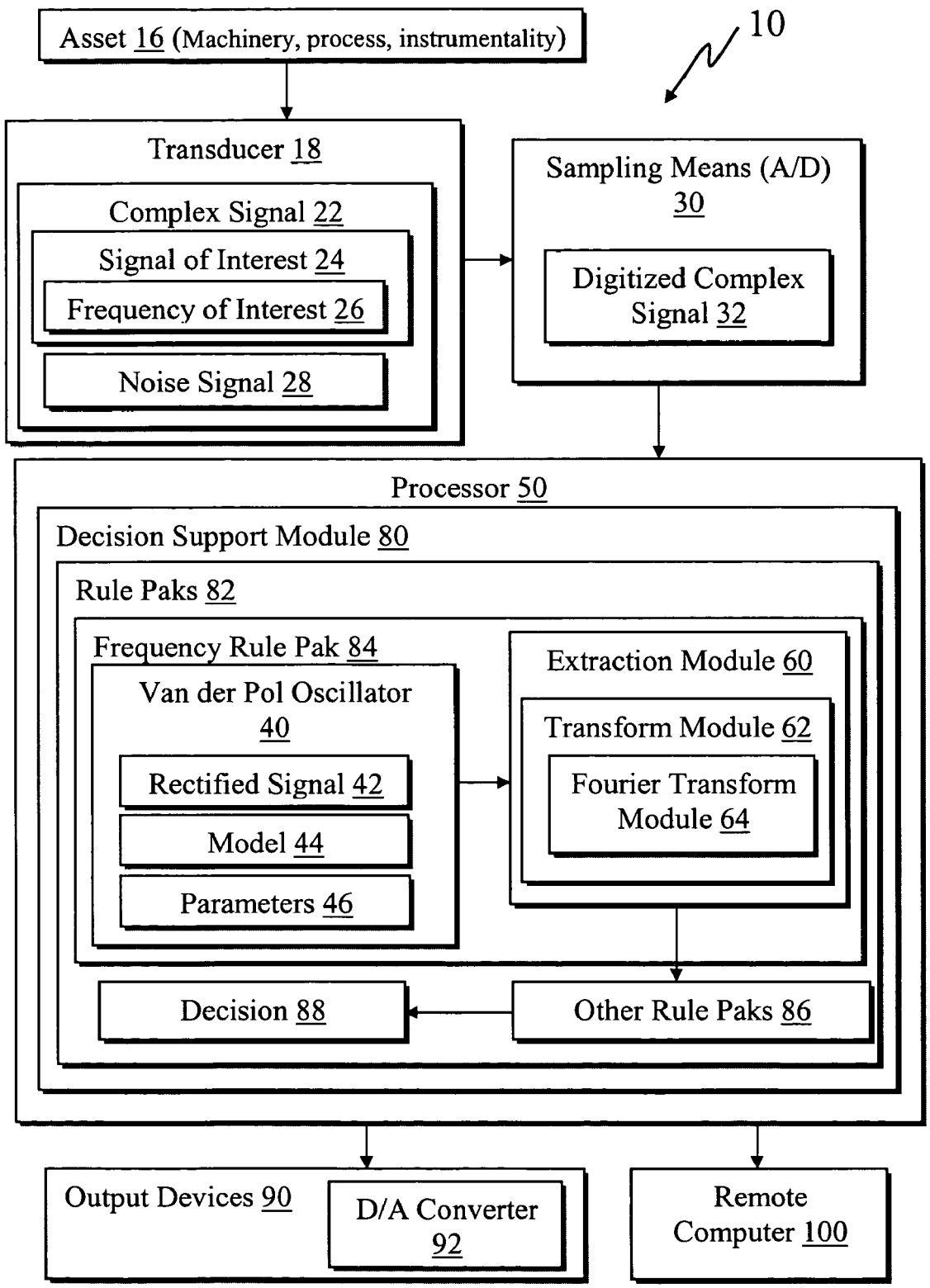
FIG. 3 is a functional block diagram view further detailing a decision support module of the frequency rectification system for recovering a signal that is hidden or buried under noise.

Referring now to FIG. 3, and in one embodiment of the invention, the processor 50 can also incorporate the decision support module 80 operatively coupled to the extractions means 60 which can be used for determining the frequency of interest 26 and for making decisions as a function of the extracted frequency of interest 26 for monitoring, protecting and/or managing assets.

In one embodiment of the invention, the decision support module 80 can be comprised of rule paks 82 which are software rule packages each comprised of rules for monitoring, protecting and/or managing assets. In one embodiment of the invention, one rule package included in rule paks 82 is a frequency rule pak or package 84 comprised of the Van der Pol Oscillator 40 and the extraction module 60 for determining the frequency of interest 26 for monitoring, protecting and/or managing assets as a function thereof.

For example, and in one aspect of use and operation, the rule paks 82 can be rule packages for induction motors comprised of the frequency rule pak 84 which, in turn, is comprised of the Van der Pol Oscillator 40 and the extraction module 60 for processing a complex signal 22 in the form of, for example, an electric current waveform representative of electric motor current of an induction motor for determining a frequency of interest 26 of the electric motor current waveform in the form of a motor shaft frequency which is then used with other frequencies in other rule paks 86 for making motor decisions 88 for the induction motor which can be conveyed to output devices 90 and/or to one or more remote computers 100 for, inter alia, automatically annunciating asset information including problems such as machinery problems to operators and other personnel and/or generating alarms based on determined anomalies or problems and using these alarms to automatically shut down assets such as machinery.

The system 10 can be further comprised of a filtering means 52 operatively coupled to the transducer or as part of the processor 50 for receiving and filtering an analog or a digital signal to a specified frequency band prior to the rectifying the signal with the Van der Pol oscillator 40. Additionally, the processor 50 can be operatively coupled, via connection 91, to physical output devices 90 such as alarms, relay outputs, or current outputs via a digital to analog converter 92. Furthermore, the processor 50 can be operatively coupled, via connection 101, to one or more remote computers 100 for transferring data there between.

Thus, in one embodiment of the invention, the system 10 can process noisy transducer signals in accordance with one aspect of the invention for monitoring assets and then can convey information to output devices 90 and/or to one or more remote computers 100 for, inter alia, automatically annunciating asset information, problems, and recommendations to operators and other personnel generating alarms based on determined anomalies or problems and using these alarms to automatically shut down assets such as machinery.

Referring to FIGS. 1 through 3, and in light of the above description, an embodiment of the invention includes a frequency rectification method, the steps including: 1) using the Van der Pol Oscillator 40 with selected parameters for rectifying a complex signal 22 comprised of a first spectrum having all of the distinctive or largest spectral peaks corresponding to noise into a rectified signal 42 which is comprised of a second different spectrum having a distinctive or largest spectral peak which corresponds to the signal of interest 24 with all other spectral peaks smaller; 2) transforming the rectified signal 42 into its spectrum and; 3) determining the frequency of interest 26 by determining the frequency of the largest spectral peak of the transformed rectified signal 42, and 4) making decisions and/or recommendations as a function of the extracted frequency of interest 26.

Additionally, and still referring to FIGS. 1 through 3, an embodiment of the invention includes a frequency rectification method, the steps including: 1) engendering or producing a complex signal 22 from an asset 16 such as a machine wherein the complex signal 22 is comprised of a signal of interest 24 having a corresponding frequency of interest 26 and further comprised of a noise signal 28 having a magnitude greater than a magnitude of the signal of interest 24 at the frequency of interest 26 wherein the signal of interest 24 is hidden under the noise signal 28; 2) sampling and digitizing the complex signal 22 into a digitized complex signal 32; 3) computer modeling a Van der Pol oscillator having parameters selected such that a natural frequency of the Van der Pol oscillator model is approximate the frequency of interest; 4) processing the digitized signal as a function of the Van der Pol oscillator model for rectifying the digitized signal into a rectified signal 42, 5) extracting the frequency of interest from the rectified digital signal, and 6) wherein the extracting step can include the step of performing Fourier transformation on the rectified digital signal for determining and evaluating a major component of said Fourier transformation for recovering the frequency of interest previously hidden under the digitized noise signal for use in for use in determining machine information and providing recommendations.

An example will now be delineated for further illustrating the system 10 (apparatus and method) and is not intended to limit the scope of the present invention as set forth herein and as described hereinbelow by the claims.

The following example includes actual experimental results which provide detail for: 1) a general description of the system 10, and 2) a particular case of the general description, using operations with digitized signals.

First, and as noted hereinabove, the frequency rectification system 10 is extremely useful when an incoming harmonic signal is deeply "buried" under heavy noise such that there are problems in recovering the signal from under the noise using traditional methods. In these cases, and in one embodiment of the invention, the recovery of the incoming harmonic signal and its frequency is provided by the frequency rectification system 10 comprised of a Van der Pol Oscillator 40 having user selectable parameters 48 chosen such that a natural frequency of the Van der Pol Oscillator 40 is close to the frequency of interest 26, means for interposing the incoming signal upon the Oscillator 40, and means for extracting a signal circulating in the Oscillator 40, which carries a larger component of the frequency of interest when the parameters of the Van der Pol Oscillator have been chosen such that the natural frequency of the Van der Pol Oscillator 40 is close to the frequency of interest 26.

In one embodiment of the invention, the Van der Pol Oscillator 40 of the system 10 has the following mathematical description: $M*d(du/dt)dt - D*(0.25*A*A - u*u)*du/dt + K*u = 0$; where u is a variable, t is time, M is mass, D is damping, A is oscillation magnitude parameter, and K is stiffness. The Van der Pol Oscillator is known as a self-exciting oscillator. That is, it produces an oscillating variable u without any external input which has a magnitude and a frequency controlled, correspondingly, by parameter A and square root of K/M.

The system 10 employs the complex signal 22 or input signal as a forcing function input into the Van der Pol Oscillator resulting in the following mathematical description: $M*d(du/dt)dt - D*(0.25*A*A - u*u)*du/dt + K*u = $ input signal. The variable u in Van der Pol Oscillator as mathematically described above is used as the output signal for extracting the signal circulating in the Oscillator 40 which carries a larger component of the frequency of interest when the parameters of the Van der Pol Oscillator have been chosen such that the natural frequency of the Van der Pol Oscillator 40 is close to the frequency of interest 26. When the forcing function, complex signal 22, is applied to the Van der Pol Oscillator it is rectified into a signal comprised of a component that has a frequency of the forcing function with properly selected parameters.

For the system 10 to work correctly, the Van der Pol Oscillator parameters 46 should be controlled so that (1) parameter A is of the same order of magnitude as the incoming signal and (2) square root of K/M is reasonably close to the frequency of the harmonic signal that is to be rectified.

One particular case of the general description, using operations with digitized signals, was performed using a Van der Pol Oscillator modeled in the SIMULINK (Dynamic System Simulation for MATLAB, version 5.0 R13) environment of the MATLAB suite (Version 6.5.018091 3a Release 13). In this one particular case, the Van der Pol Oscillator is modeled with the following parameters: M=1, D=1, A=1, K=1. The above parameters of the Van der Pol Oscillator are chosen so that the non-disturbed Oscillator produces oscillations with a frequency of 1 radian per second. The input harmonic signal is chosen with its amplitude equal to 1 and a frequency of 0.95 radians per second. White noise is chosen so that it confidently hides the input harmonic signal both in time domain and frequency domain: The latter is done to demonstrate that system 10 is effective under conditions where conventional tools to recover the signal would not work.

Figure 4:
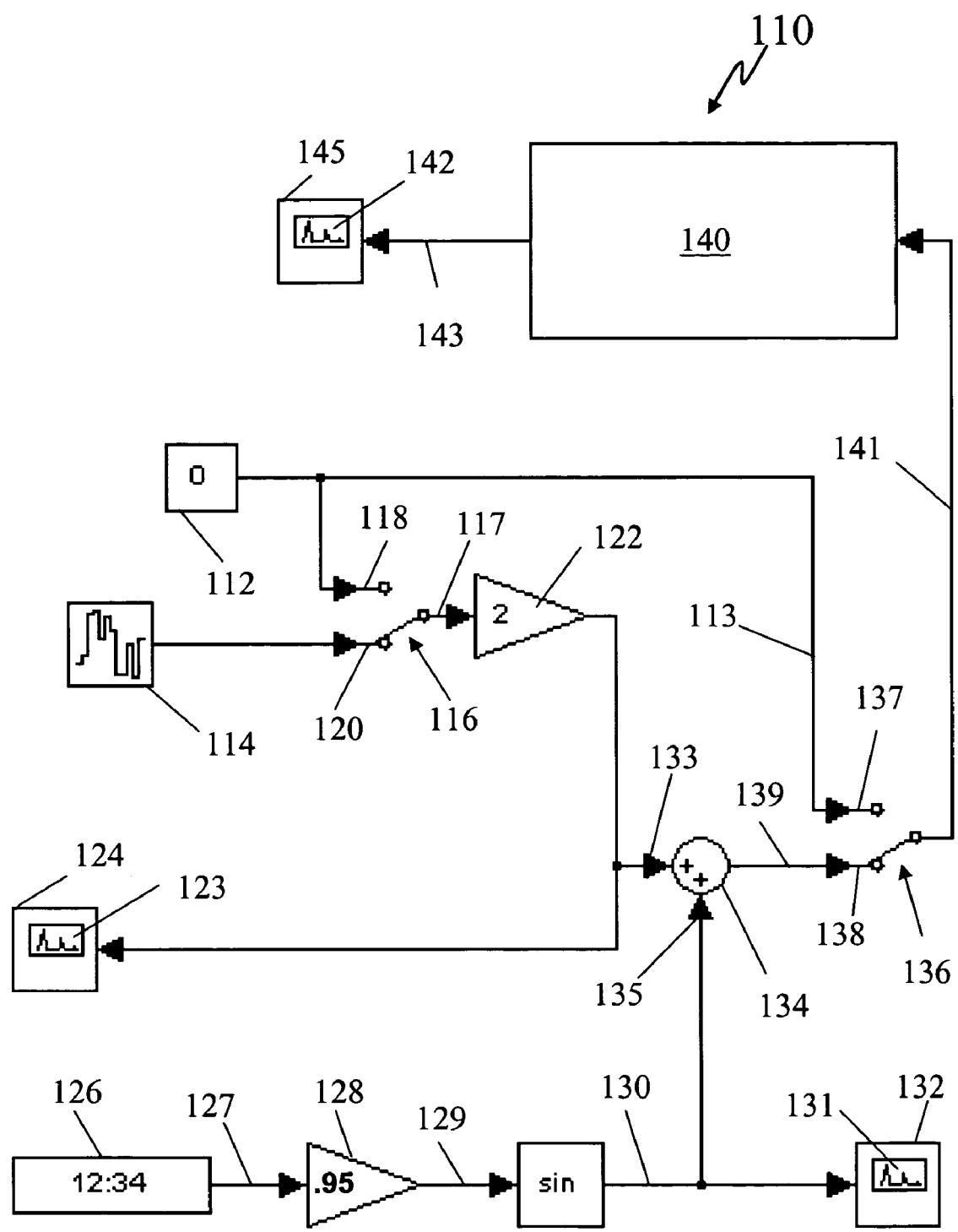
FIG. 4 is a functional block diagram view of a model of the frequency rectification system used for recovering a signal that is hidden or buried under noise.
Figure 5:
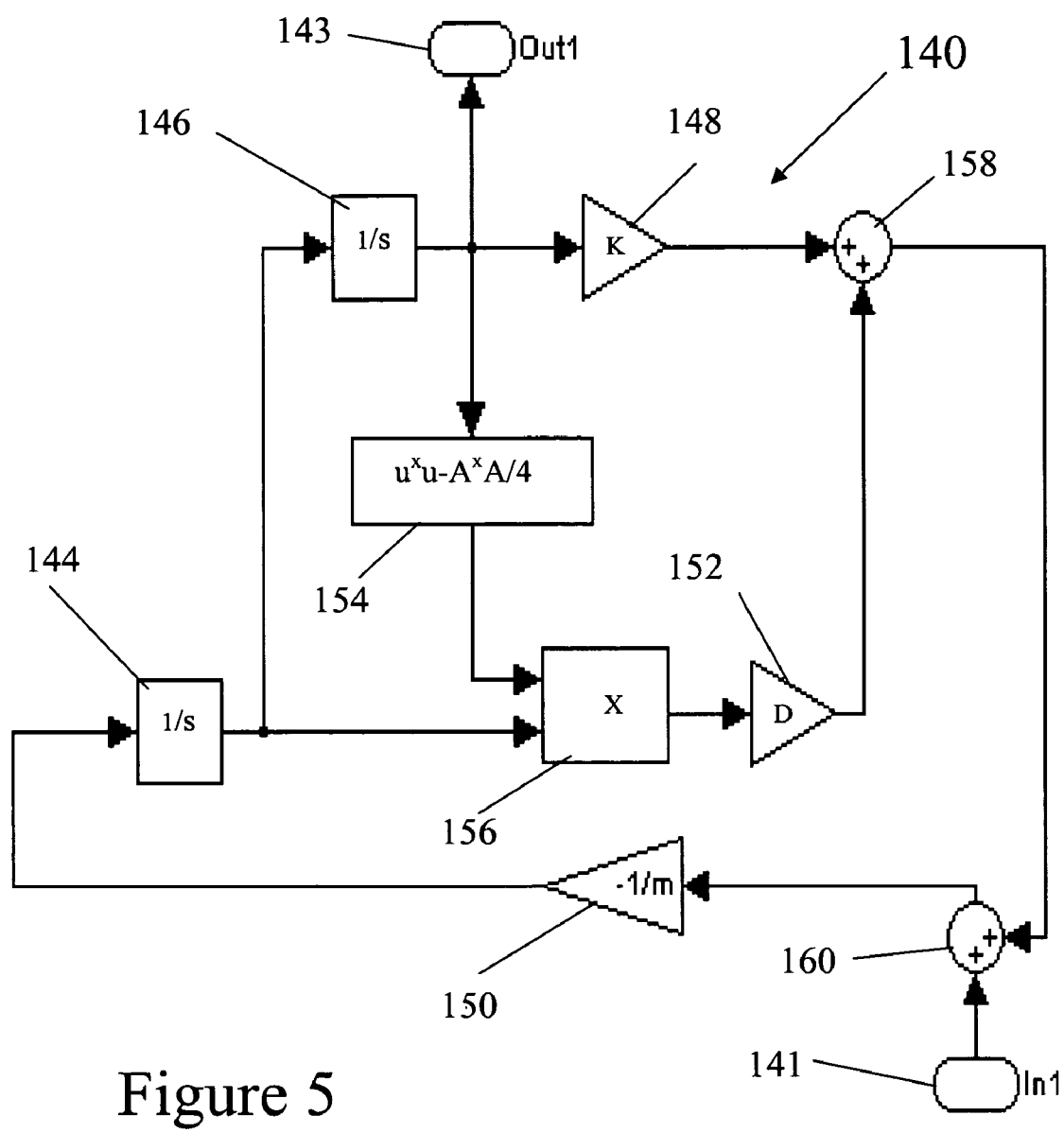
FIG. 5 is a functional block diagram view further detailing a Van der Pol Oscillator of the modeled frequency rectification system shown in FIG. 4.

FIG. 4 is a functional block diagram that represents the exact SIMULIINK for MATLAB modeled system 110 used in three experiments to illustrate how the system 10 works and is the model used to produce the graphical representations shown in FIGS. 6 through 11. FIG. 5 further details the Van der Pol Oscillator model shown in FIG. 4.

At the outset, please note that on FIGS. 6 through 11, vertical axes have no units; they display nondimensional units, internal to SIMULINK/MATLAB. For all the time base plots of waveforms, horizontal axes display time measured in seconds. For all the frequency base plots of waveforms (these are also called spectra), horizontal axes display frequency measured in radians per second.

The modeled system 110 includes the following connected elements as shown: a Constant block 112 that produces a zero signal and a Band-Limited White Noise block 114 that produces random noise signal with magnitude 1 both operatively coupled to a first switch 116 via switch inputs 118, 120, respectively. The first switch 116 is operatively coupled to a Noise Level amplifier 122 via switch output 117. The Noise Level amplifier 122 amplifies the noise signal by 2 and the output of this block, depending on the first switch 116 position, is either zero or a amplified random noise signal 123. The amplified random noise signal 123 is an example of the noise signal 28. The modeled system 110 further includes a Digital Clock block 126 that produces the time variable, a Frequency amplifier 128 connected, via connection 127, to the Clock block 126 for amplifying the time variable by 0.95, resulting in the 0.95*time variable, and a Trigonometric Function block 130 connected, via connection 129, to the Frequency amplifier 128 for producing a sin(0.95*time) variable. Thus, the output of this block is a sinusoidal signal 131 with magnitude one and a frequency of interest equal to 0.95 rad/sec wherein the goal of the frequency rectification system 10 and thus the modeled system 110 is to help in detecting of this particular frequency of 0.95 rad/sec. A summation block 134 is connected, via connection 133, 135, to the Noise Level amplifier 122 and the Trigonometric Function block 130, respectively. The summation block is either pure sinusoidal signal by itself, or mixed with double magnitude random noise, depending on the first switch position 116. A second switch 136 having inputs 137, 138 are operatively coupled, via connections 113, 139, to the Constant block 112 and an output of summation block 134, respectively. In turn, a Van der Pol Oscillator block 140 is connected, via connection 141, to an output of the second switch 136 and is comprised of the Van der Pol Oscillator 40 including the computer model 46 with selectable parameters 48. Three displays 124, 132, and 145 respectively display the noise signal 123, the pure harmonic signal 131, and the rectified signal 143.

FIG. 5 is a functional block diagram further detailing Van der Pol Oscillator block 140 and modeling Van der Pol Oscillator 40 used in FIG. 4 as a closed loop (which represents the above Van der Pol Equation) with added Input 141 and Output 143 and including the following connected elements as shown: Two integration blocks 144, 146; Three amplifiers: a Stiffness amplifier 148, a 1/mass amplifier 150, and a damping amplifier 152 which amplify signals with K=1, −1, and 1, respectively; A function block 154, which raises the signal into second power and then subtracts ¼ from it (since A=1); a product block 156; and two Summation blocks 158, 160.

Referring now to FIGS. 4 and 5, three experiments which illustrate how the system 10 works are as follows: In the first experiment, the Van der Pol Oscillator model 140 is disconnected from any external source via switch 136. In the second experiment, the Van der Pol Oscillator is connected to the pure harmonic signal via switch 136 and switch 116 being connected to the zero constant block 112. In the third experiment, the Van der Pol Oscillator is connected to a mix of pure harmonic signal and white noise via switch 136 and switch 116.

Below are the results from the above three experiments.

The first experiment is performed for illustration purposes only wherein switch 136 is connected to the constant zero via connection 113. Thus, the input harmonic signal is not connected to the Van der Pol Oscillator and there is no added noise. In this particular experiment, the Van der Pol Oscillator is not disturbed, therefore it produces mostly its own frequency 1 rad/s with magnitude 1. Note that this natural frequency is chosen so that it is approximate to frequency of the input signal (0.95 rad/s).

Figure 6:
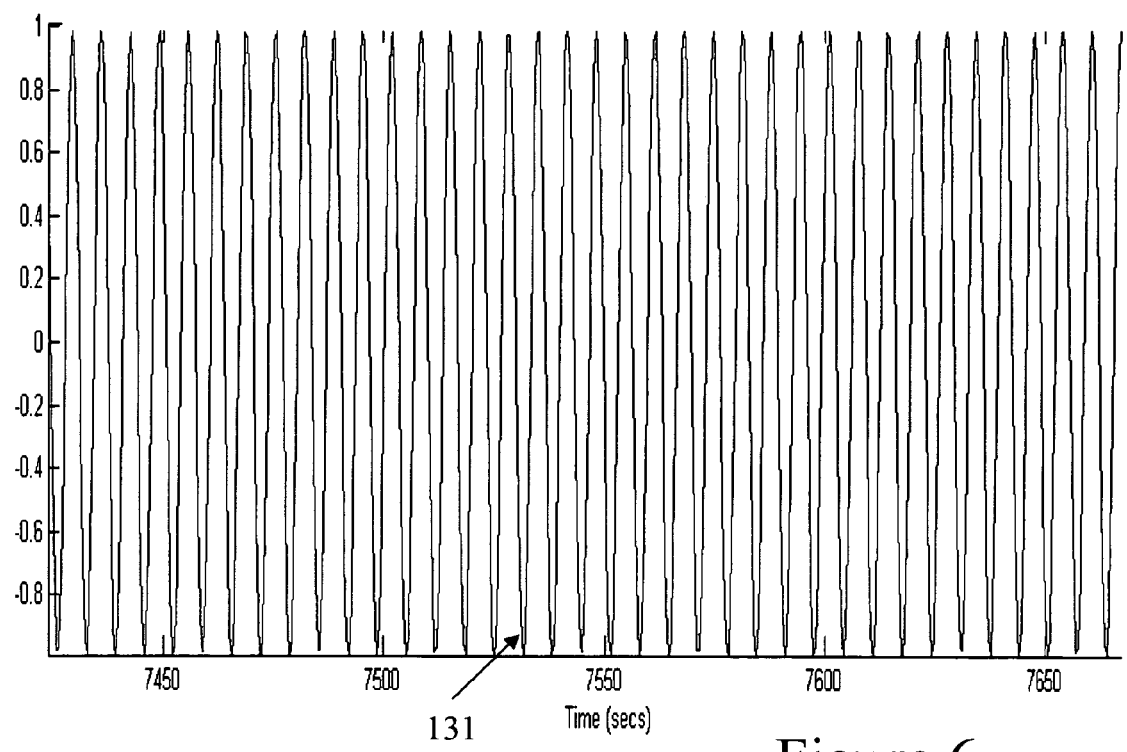
FIG. 6 is a graphical representation of a time-based input harmonic signal which in this case is the signal of interest produced by the modeled frequency rectification system shown in FIG. 4.
Figure 7:
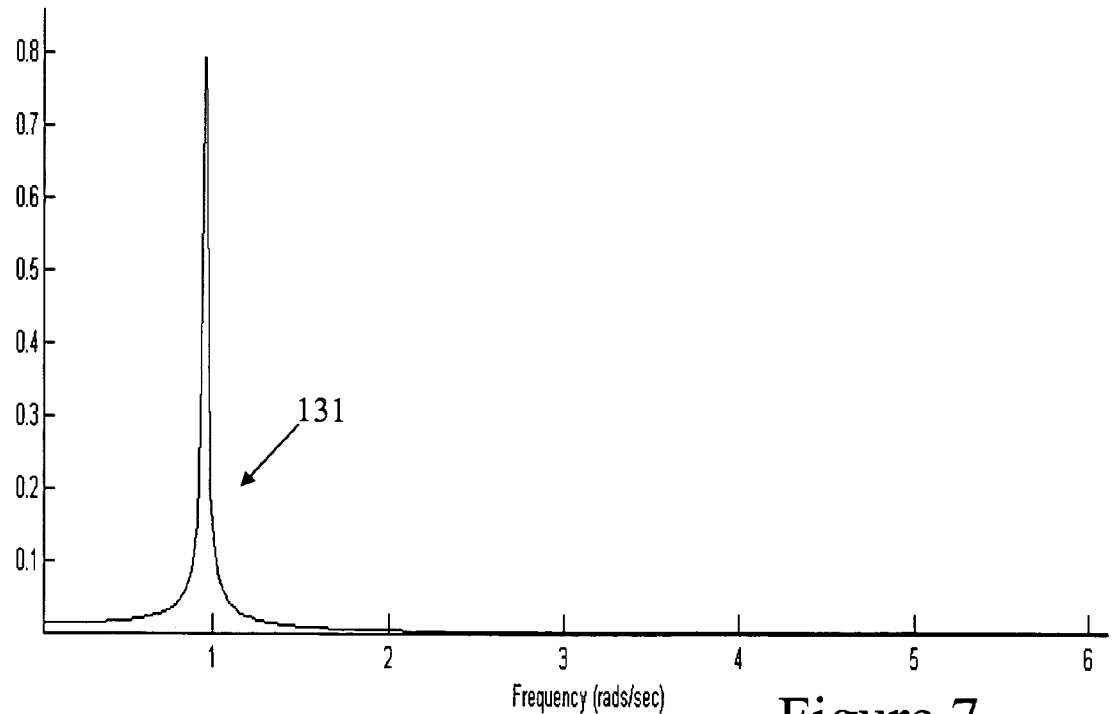
FIG. 7 is a graphical representation of a frequency based input harmonic signal which in this case is the signal of interest produced by the modeled frequency rectification system shown in FIG. 4.

In the second experiment, there is still no added noise and the input harmonic signal 131, illustrated in FIGS. 6 and 7, is placed onto the Van der Pol Oscillator as an external force by switch 136 connecting with input or connection 138 and switch 116 being connected to input or connection 118.

FIG. 6 illustrates a time-based graphical representation of the input harmonic signal 131 sin(0.95*time) which in this case is the signal of interest 24 having an amplitude of one and a frequency of interest of 0.95 radians per second.

Additionally, FIG. 7 illustrates a frequency-based graphical representation of the input harmonic signal 131 sin (0.95*time) which in this case is the signal of interest 24 having an amplitude of one and a frequency of interest of 0.95 radians per second.

In the second experiment, the rectified output signal is taken from the Van der Pol Oscillator it shows a major component with a frequency of 0.95 radians per second. It does not produce its own frequency 1 radian per second, but produces, instead, the frequency of interest of 0.95 radians per second with magnitude 1.8. Thus, the Van der Pol Oscillator of the system 110 synchronizes to the outside frequency.

In the third experiment, switch 136 is connected to input or connection 138 and switch 116 is connected to input or connection 120 such that the input signal is a mix of one, the pure sinusoidal signal 131 which in this case is the signal of interest 24 having amplitude equal to 1 and a frequency of 0.95 radians per second (FIGS. 6 and 7) and two, the overwhelming or dominating white noise signal 123 which in this case is the noise signal 28. Thus, the signal of interest, sinusoidal signal 131, is completely buried under such heavy noise, white noise signal 123, such that it cannot be easily distinguished from noise components in the spectrum.

Figure 8:
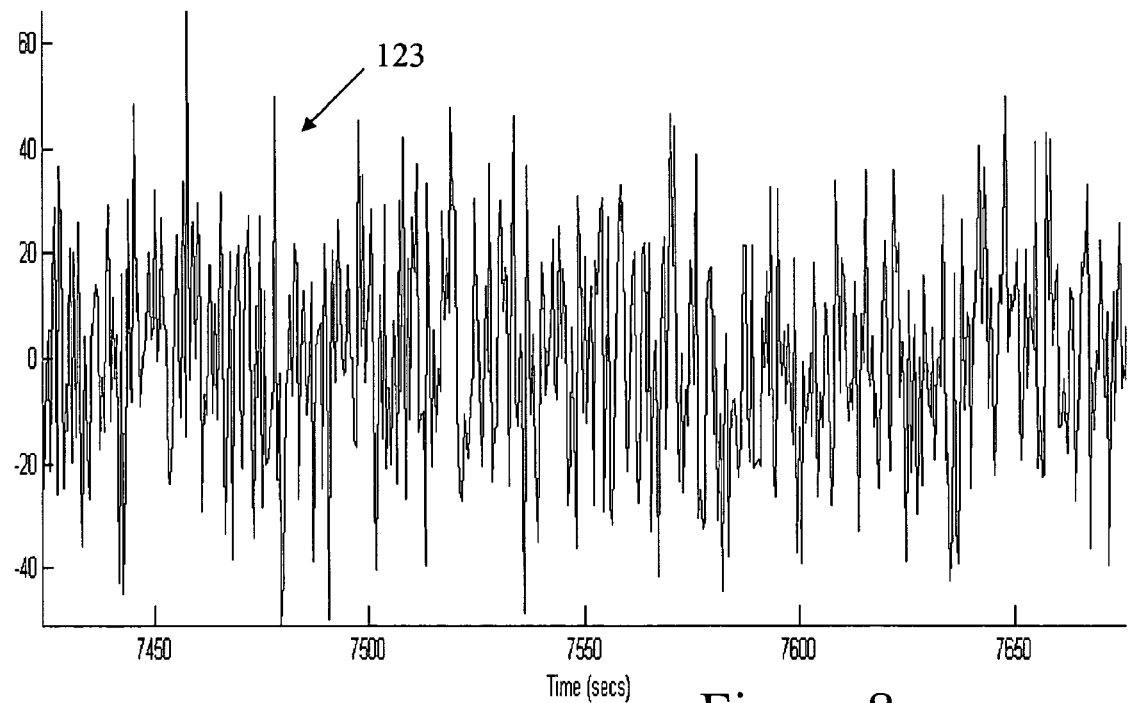
FIG. 8 is a graphical representation of a time-based input noise signal produced by the modeled frequency rectification system shown in FIG. 4 and which is significant, so that it confidently hides or buries under itself the input harmonic signal both in time domain and frequency domain.

FIG. 8 shows the time-based graphical representation of the input noise signal 123 which is significant, so that it confidently hides or buries under itself the input harmonic signal 131 shown in FIGS. 6 and 7 in time and frequency domain, respectively.

Figure 9:
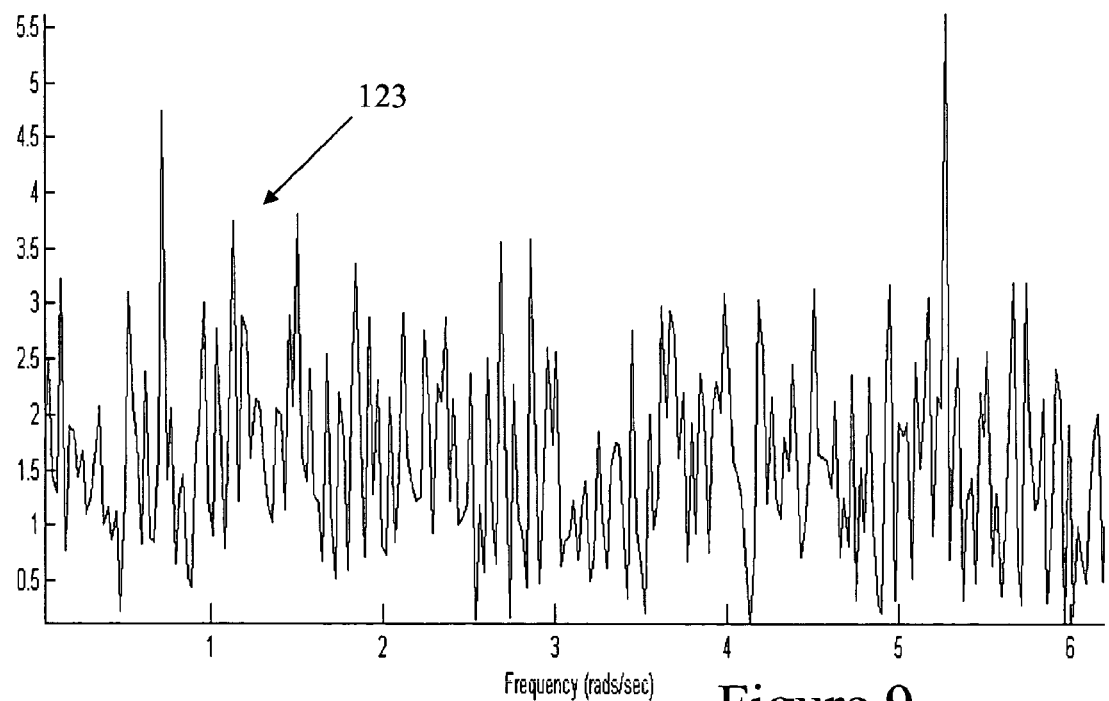
FIG. 9 is a graphical representation of a frequency based input noise signal produced by the modeled frequency rectification system shown in FIG. 4 and which is significant, so that it confidently hides or buries under itself the input harmonic signal both in time domain and frequency domain.

Additionally, FIG. 9 shows a frequency based graphical representation of the input noise signal 123 which is significant, so that it confidently hides or buries under itself the input harmonic signal shown in FIGS. 6 and 7 in time and frequency domain, respectively.

Thus, in this experiment, the noise is significant, so that it confidently hides the input harmonic signal both in the time domain and the frequency domain. Still, the system 10 rectifies the input signal from the noise and the spectrum of the signal, coming out of the Van der Pol Oscillator, has a dominating component with a frequency of 0.95 radians per second which is exactly the frequency of interest of the sinusoidal signal 131. This frequency can be detected as discussed above as a result of the system abating all of the noise components which, although are existing in the spectrum, are much lower.

Figure 10:
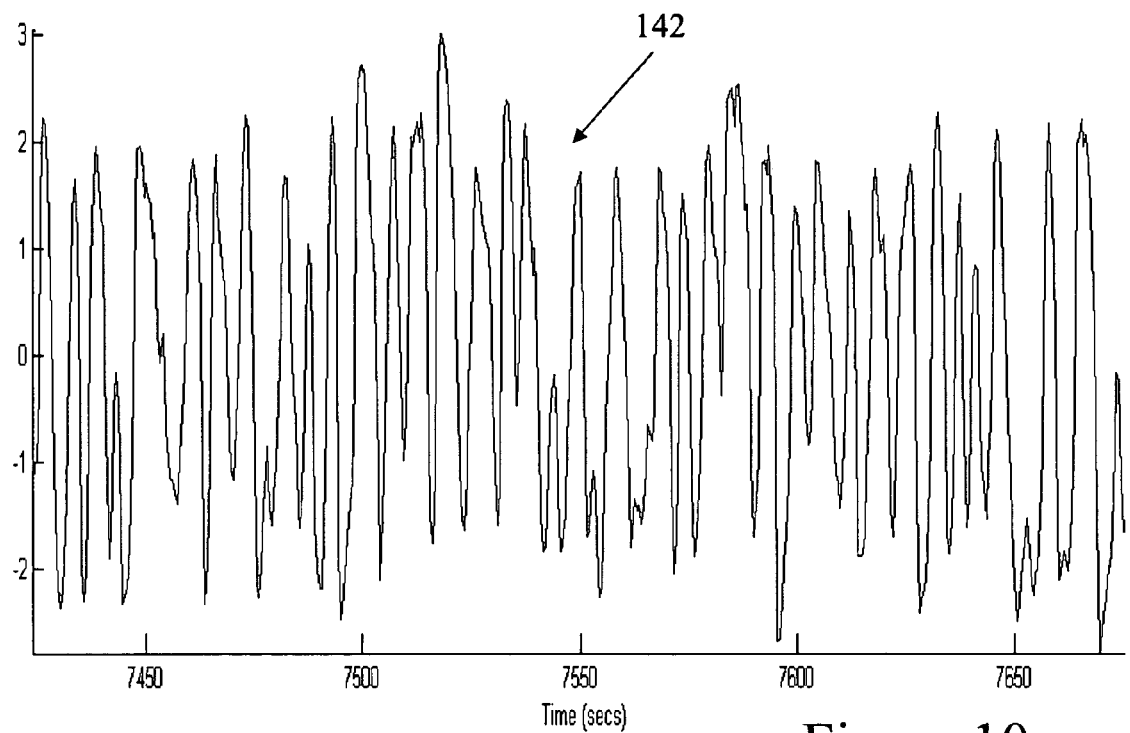
FIG. 10 is a graphical representation of a time-based rectified output signal produced by the modeled frequency rectification system shown in FIG. 4 for recovering the signal of interest that is hidden or buried under noise.
Figure 11:
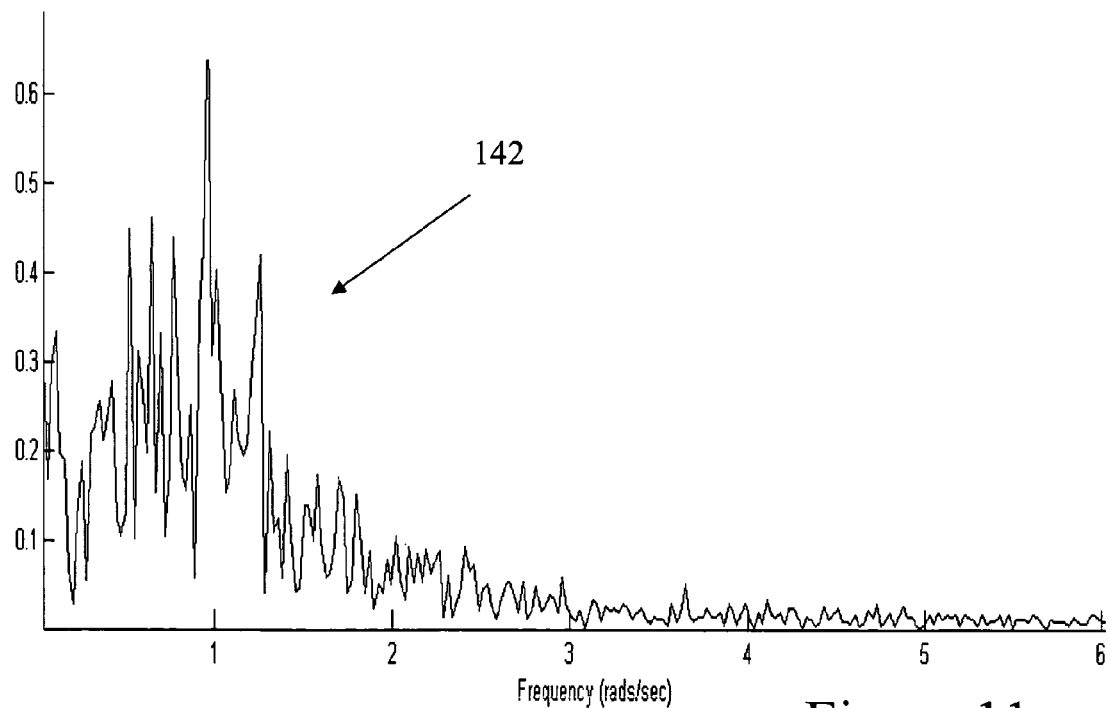
FIG. 11 is a graphical representation of a frequency based rectified output signal produced by the modeled frequency rectification system shown in FIG. 4 for recovering the signal of interest that is hidden or buried under noise.

Referring to FIG. 10, the rectified signal 142 is shown in a time-based domain while, in FIG. 11, the rectified signal 142 is shown in a frequency based domain revealing a major component with a frequency of 0.95 radians per second.

Thus, from the above experiment it can be seen that the system 10 allows consequent recovery of the frequency of interest from the determined largest peak (in frequency domain). That is, the frequency of the determined largest peek is the frequency of interest. Additionally, it should be noted that in the above experiments a 1% difference was used between the frequency of the harmonic signal (i.e., frequency of interest) and the natural frequency of the Van der Pol oscillator (i.e., the square root of K/M). This 1% should not be considered as a limitation and, in fact, the weaker the noise is, the further apart these frequencies can be.

Figure 12:
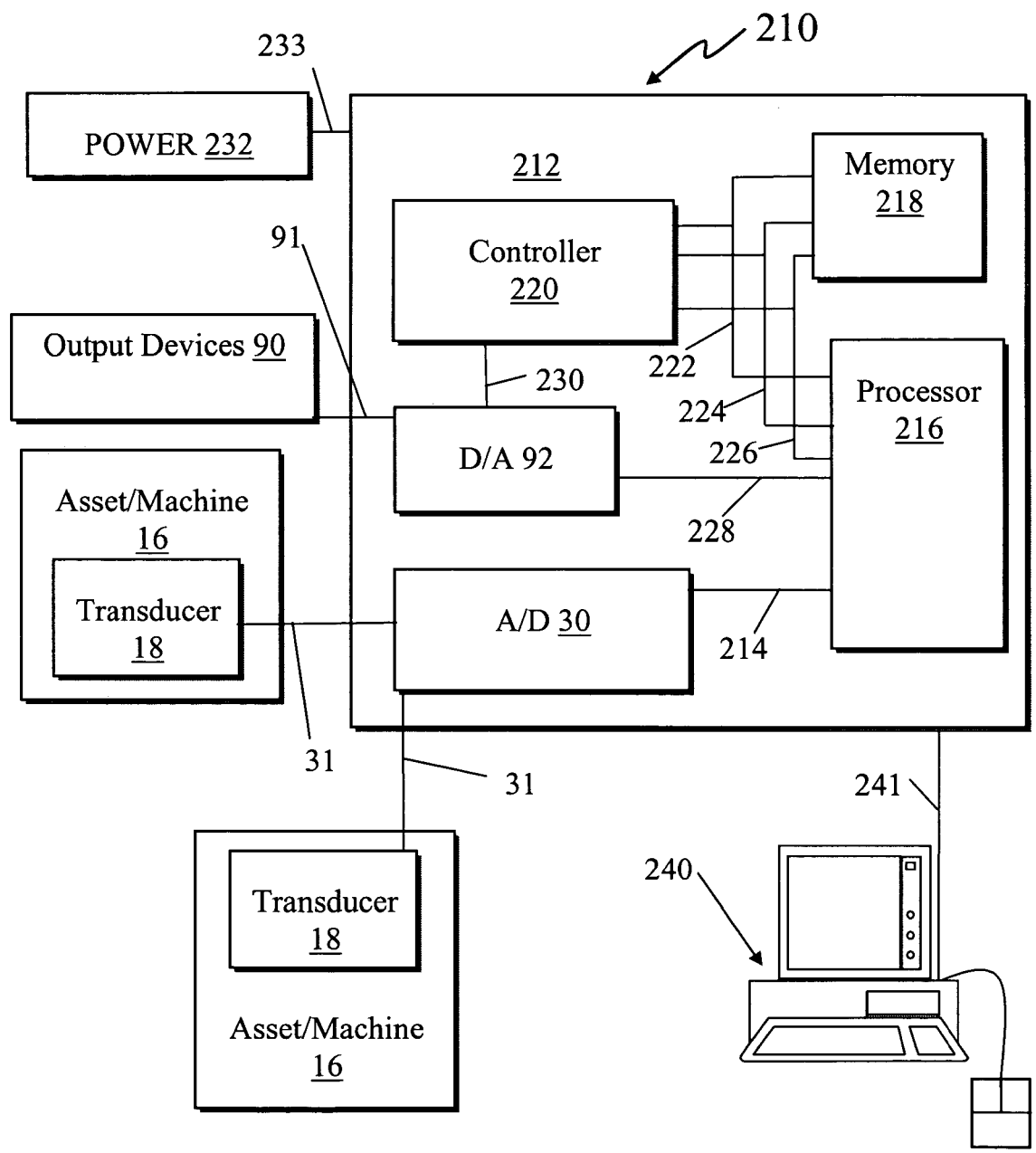
FIG. 12 is a functional block diagram view of the frequency rectification system shown in one aspect of use and operation for recovering a signal that is hidden or buried under noise.

In use and operation, and referring to the drawings, the system 10: apparatus and method can be included or embodied in an asset monitoring system such as a machinery monitoring system 210 as illustrated in FIG. 12 and comprised of a monitor 212 operatively coupled to machinery assets 16, via at least one transducer 18, and to a computerized condition monitor 240. Examples of asset monitors and monitoring software are presently manufactured and sold by Bently Nevada, LLC, 1631 Bently Parkway South, Minden, Nev., 89423, United States Of America. Additionally, a variety of transducers which can be employed in the system are presently manufactured and sold by Bently Nevada, LLC, 1631 Bently Parkway South, Minden, Nev., 89423, United States Of America.

More specifically, and Referring to FIG. 12, one example of the machinery monitoring system, including the system 10, is comprised of the monitor 212 operatively coupled, via connection 241, to the computerized condition monitor 240 and to at least one transducer 18 which, in turn, is operatively coupled to machine 16 for engendering or producing a complex signal 22 from the machine 16 which is outputted to the monitor 212 and wherein the complex signal 22 is comprised of a signal of interest 24 having a corresponding frequency of interest 26 and further comprised of a noise signal 28 having a magnitude greater than a magnitude of the signal of interest 24 at the frequency of interest 26 wherein the signal of interest 24 is hidden under the noise signal.

The monitor 212 is comprised of a sampling/digitizing device or analog to digital converter device 30 operatively coupled to at least the one transducer 18 via connection 31 for receiving, sampling, and digitizing the outputted complex signal 22 into a digitized complex signal 32.

The monitor 212 is further comprised of, a processing device 216, an associated memory 218, and a controller 220. The processing device 216 is operatively coupled to the analog to digital converter 30 via connection 214. In turn, the processing device 216 is operatively coupled to the associated memory 218 and to controller 220 such that the processing device 216 and associated memory 218 are connected, via connections 222 (data bus), 224 (address bus), and 226 (control lines), to each other and to the controller 220.

The processing device 216 receives the digitized complex signal 32 outputted from the analog to digital converter device 30 via connection 214 and, in turn, can pass the digitized signal to the computerized condition monitor 240 which can be comprised of processor 50 including Van der Pol Oscillator 40, extraction module or means 60, and decision support module or means 80 including rule packages 82 (see also FIG. 3) for computer modeling a Van der Pol oscillator having parameters selected such that a natural frequency of the Van der Pol oscillator model is approximate the frequency of interest, processing the digitized signal as a function of the Van der Pol oscillator model for rectifying the digitized signal into a rectified signal 42, and extracting the frequency of interest from the rectified digital signal for use in determining machine information. The extracting step can be further comprised of performing a Fourier transformation on the rectified digital signal evaluating a major component of said Fourier transformation for recovering the frequency of interest previously hidden under the noise signal for use in, for example, monitoring, protecting and/or managing assets including a multifarious grouping of machinery, processes, and instrumentalities and conveying this information to output devices 90 or a remote computer 100 for, inter alia, generating machinery knowledge, for automatically annunciating information including to machinery problems and recommendations to operators and other plant personnel, and/or generating alarms based on determined problems and using these alarms to automatically shut down an asset such as a machine.

The computerized condition monitor 240 can be a laptop, notebook, desktop, networked, and/or a distributed computer or the like and include computerized condition monitoring software running on the computer comprised of a processor, associated memory, and storage medium. The processing and storage device is operatively coupled to at least one entry device such as a selection or mouse device, and/or a keyboard and also, to a graphical user interface including a display. Communication between a user, the processing and storage device, and the monitor 212 is done through the graphical user interface.

Additionally, it should be noted that that the processing device 216 can also be comprised of processor 50 including Van der Pol Oscillator 40, extraction module or means 60, and decision support module or means 80 for computer modeling a Van der Pol oscillator having parameters selected such that a natural frequency of the Van der Pol oscillator model is approximate the frequency of interest, processing the digitized signal as a function of the Van der Pol oscillator model for rectifying the digitized signal into a rectified signal 42, and extracting the frequency of interest from the rectified digital signal for use in determining machine information.

One or more power supplies 232 are operatively coupled, via connection 233, to provide any required power to transducers 18, monitor 212, physical output devices 90, and/or computerized condition monitor 240.

The above delineation of the frequency rectification system 10 including its use and operation for processing noisy signals of assets including a multifarious grouping of machinery, processes, and instrumentalities demonstrates the industrial applicability of this invention.

Moreover, having thus described the present invention, it should be apparent that numerous modifications and adaptations may be resorted to without departing from the scope and fair meaning of the present invention as set forth hereinabove and as described hereinbelow by the claims.

We claim:

1. A frequency rectification system for processing asset signals, said system comprising in combination:
   a signal generator means for generating a complex signal from an asset, said complex signal comprised of a noise signal and a signal of interest having a corresponding frequency of interest wherein said complex signal includes a first spectrum having largest spectral peaks corresponding to said noise signal and comprised of at least one largest spectral peak at said frequency of interest which is larger than a spectral peak of said signal of interest at said frequency of interest wherein said signal of interest at said frequency of interest is hidden under said noise signal;

a Van der Pol oscillator operatively coupled to said signal generator means and including selectable parameters for receiving and rectifying said complex signal into a rectified signal comprised of a second spectrum having a largest spectral peak corresponding to said signal of interest with all other spectral peaks smaller, and extraction means, operatively coupled to said Van der Pol oscillator, for extracting said frequency of interest from said rectified signal for use in providing asset information.

2. The system of claim 1 further including decision support means, operatively coupled to said extraction means, for making decisions as a function of the extracted frequency of interest for use in any combination of monitoring, protecting, and managing the asset.

3. The system of claim 2 wherein said decision support means further includes means for providing recommendations based on said decision making for use in any combination of monitoring, protecting, and managing the asset.

4. The system of claim 1 wherein said asset is a machine.

5. The system of claim 1 wherein said asset is a process.

6. The system of claim 1 wherein said asset is an instrumentality for measuring physical asset parameters.

7. A frequency rectification system for processing asset signals, said system comprising:

means for generating a signal from an asset comprised of a signal of interest having a corresponding frequency of interest;

said signal further including a noise signal having a magnitude greater than a magnitude of said signal of interest at said frequency of interest wherein said signal of interest is hidden under said noise signal;

a Van der poi oscillator operatively coupled to said signal generating means for rectifying said signal for providing said noise signal with a magnitude less than said magnitude of said signal of interest, and means for extracting said frequency of interest from said rectified signal for use in determining asset information.

8. The system of claim 7 further including decision support means, operatively coupled to said extraction means, for making decisions as a function of said extracted frequency of interest for use in any combination of monitoring, protecting, and managing the asset.

9. The system of claim 8 wherein said decision support means further includes means for providing recommendations based on said decision making for use in for use in any combination of monitoring, protecting, and managing the asset.

10. The system of claim 9 wherein said signal generating means is comprised of a transducer operatively coupled to a machine for measuring physical machine parameters correlative to machine status and outputting said signal comprised of said signal of interest having said corresponding frequency of interest and said signal further including said noise signal wherein the magnitude of the noise signal is greater than the magnitude of said signal of interest at said frequency of interest wherein said signal of interest is hidden under said noise signal.

11. The system of claim 10 wherein said signal generating means is further comprised of a sampling means, connected to said transducer, for sampling and digitizing said signal into a digitized signal.

12. The system of claim 11 further including a processor operatively coupled to said sampling means and including said Van der Pol oscillator in the form of a Van der Pol oscillator model having parameters selected for setting a natural frequency of said Van der Pol oscillator model near said frequency of interest for rectifing said digitized signal into a rectified output signal.

13. The system of claim 12 wherein said processor further includes said means for extracting said frequency of interest from said rectified output signal by performing a Fourier transform on said rectified output signal and evaluating a major component of said Fourier transformation for recovering said frequency of interest previously hidden under said noise signal for use in determining asset information.

14. The system of claim 13 wherein said machine is a motor and wherein said signal is a signal representing electric motor current.

15. The system of claim 13 wherein said machine is a turbine and wherein said signal is a signal representing turbine casing vibration.

16. The system of claim 7 wherein said asset is a machine.

17. The system of claim 7 wherein said asset is a process.

18. The system of claim 7 wherein said asset is an instrumentality for measuring physical asset parameters.

19. A frequency rectification method for processing asset signals, the steps including:

computer modeling a Van der Pol oscillator having an input and an output;

selecting parameters of the Van der Pol oscillator model for setting a natural frequency of the Van der Pol oscillator model approximate a frequency of interest of a signal of interest;

applying a complex signal to the input of the Van der Pol oscillator wherein the complex signal is comprised of a noise signal and the signal of interest having the corresponding frequency of interest and wherein the complex signal includes a first spectrum having largest spectral peaks corresponding to the noise signal and comprised of at least one largest spectral peak at the freciuencv of interest which is larger than a spectral peak of the signal of interest at the freciuencv of interest wherein the signal of interest at the frequency of interest is hidden under the noise signal;

corresponding to said noise signal and comprised of at least one largest spectral peak at said freciuencv of interest which is larger than a spectral peak of said signal of interest at said frequency of interest wherein said signal of interest at said frequency of interest is hidden under said noise signal;

rectifying the complex signal with the Van der Pol oscillator model for providing a rectified output signal wherein the noise signal is abated and the rectified output signal is comprised of a second spectrum having a largest spectral peak corresponding to the signal of interest with all other spectral peaks smaller;

transforming the rectified output signal into a spectrum;

determining the frequency of interest by determining a frequency of the largest spectral peak of the transformed rectified output signal; and making decisions as a function of the frequency of the largest spectral peak of the transformed rectified output signal.

20. The frequency rectification method of claim 19 further including the step of making recommendations based on the decision making step for use in any combination of monitoring, protecting, and managing the asset.

* * * * *